(12) United States Patent
Akiba et al.

(10) Patent No.: US 9,129,912 B2
(45) Date of Patent: Sep. 8, 2015

(54) ENCAPSULANT, ENCAPSULATED SUBSTRATE HAVING SEMICONDUCTOR DEVICES MOUNTING THEREON, ENCAPSULATED WAFER HAVING SEMICONDUCTOR DEVICES FORMING THEREON, SEMICONDUCTOR APPARATUS, AND METHOD FOR MANUFACTURING SEMICONDUCTOR APPARATUS

(71) Applicant: SHIN-ETSU CHEMICAL CO., LTD., Tokyo (JP)

(72) Inventors: Hideki Akiba, Annaka (JP); Toshio Shiobara, Annaka (JP); Susumu Sekiguchi, Takasaki (JP); Tomoaki Nakamura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/066,212

(22) Filed: Oct. 29, 2013

(65) Prior Publication Data

US 2014/0138857 A1 May 22, 2014

(30) Foreign Application Priority Data

Nov. 16, 2012 (JP) ................................. 2012-252697

(51) Int. Cl.
*H01L 23/29* (2006.01)
*H01L 23/31* (2006.01)
*H01L 21/56* (2006.01)

(52) U.S. Cl.
CPC .......... *H01L 23/3114* (2013.01); *H01L 21/561* (2013.01); *H01L 21/565* (2013.01); *H01L 2224/45144* (2013.01); *H01L 2224/48091* (2013.01); *Y10T 428/2495* (2015.01); *Y10T 428/24967* (2013.01)

(58) Field of Classification Search
CPC ..... H01L 21/561; H01L 21/568; H01L 24/97; H01L 23/293; H01L 2924/0253
See application file for complete search history.

(56) References Cited

U.S. PATENT DOCUMENTS

| 6,538,317 | B1 | 3/2003 | Miyata | |
|---|---|---|---|---|
| 2004/0115868 | A1* | 6/2004 | Ono | 438/127 |
| 2010/0052153 | A1* | 3/2010 | Koizumi et al. | 257/697 |
| 2011/0114984 | A1* | 5/2011 | Seong | 257/98 |
| 2012/0161339 | A1* | 6/2012 | Sekiguchi et al. | 257/791 |

FOREIGN PATENT DOCUMENTS

| JP | A-2001-44324 | 2/2001 |
|---|---|---|
| JP | A-2003-213087 | 7/2003 |
| JP | A-2009-32842 | 2/2009 |

* cited by examiner

*Primary Examiner* — A. Sefer
(74) *Attorney, Agent, or Firm* — Oliff PLC

(57) ABSTRACT

The invention provides an encapsulant for collectively encapsulating a semiconductor devices mounting surface of a substrate having semiconductor devices mounting thereon or a semiconductor devices forming surface of a wafer having semiconductor devices forming thereon, and the encapsulant comprises a supporting substrate having a difference of a linear expansion coefficient from that of the substrate or the wafer of 5 ppm or less and a thermosetting resin layer being laminated, wherein the thermosetting resin layer has a shape having a height difference to a thickness direction.

26 Claims, 5 Drawing Sheets

ENCAPSULANT, ENCAPSULATED SUBSTRATE HAVING SEMICONDUCTOR DEVICES MOUNTING THEREON, ENCAPSULATED WAFER HAVING SEMICONDUCTOR DEVICES FORMING THEREON, SEMICONDUCTOR APPARATUS, AND METHOD FOR MANUFACTURING SEMICONDUCTOR APPARATUS

BACKGROUND OF THE INVENTION

1. Field of the Invention

The present invention relates to an encapsulant, an encapsulated substrate having semiconductor devices mounting thereon or an encapsulated wafer having semiconductor devices forming thereon using the encapsulant, a semiconductor apparatus manufactured by these and a method for manufacturing the same.

2. Description of the Related Art

A method for encapsulating a wafer level or a method for one-surface molding of an organic substrate on which semiconductor devices have been mounted in a matrix state with a thermosetting epoxy resin has heretofore been proposed and investigated (Patent Documents 1 to 3).

When a semiconductor apparatus is manufactured by the above-mentioned method, if a size of a substrate is small, a warp of the substrate after encapsulating can be controlled by adjusting a linear expansion coefficient of the epoxy resin.

When a substrate such as a wafer with a small diameter of 8 inches (200 mm) or less, or an organic substrate with a small size is used, encapsulating and molding can be carried out at the present facilities without any significant problems, but in a wafer having a diameter of 8 inches or more, or an organic substrate with a large size, a shrinkage stress of the epoxy resin is large so that remarkable warps or cracks of the substrate causes in the wafer or the organic substrate subjected to one-surface molding after encapsulating, whereby a semiconductor apparatus cannot be manufactured.

To solve the problems as mentioned above in the wafer or the substrate accompanied by becoming their sizes larger, it is necessary to use a filler with a level of 95% by mass or to make a shrinkage stress at the time of curing smaller by making elasticity of the resin low.

PRIOR ART DOCUMENTS

Patent Documents

Patent Document 1: Japanese Patent Laid-Open Publication No. 2001-044324
Patent Document 2: Japanese Patent Laid-Open Publication No. 2003-213087
Patent Document 3: Japanese Patent Laid-Open Publication No. 2009-032842

SUMMARY OF THE INVENTION

However, a thermosetting resin to which a filler is filled with a 95% by mass level and the composition having sufficiently moldable properties cannot yet be produced at present. Also, if the resin is made a low elasticity to a level of not generating warp, inconveniences of lowering in heat resistance or humidity resistance occur.

Also, when a substrate having a plural number of semiconductor devices mounting thereon is encapsulated by a resin to form an encapsulating layer, if there is a faulty semiconductor device(s), encapsulating is carried out after removing the faulty device(s). In this case, an amount of the resin necessary for forming the encapsulating layer increases with an amount of the volume of the removed faulty device. Therefore, it is necessary to control the volume of the resin necessary for forming the encapsulating layer.

However, it is extremely complicated to adjust the filling amount necessary for encapsulating by calculating the amount of the resin at the time of every encapsulating procedure, and it causes the problems that the time of the procedure is increased, and a void(s) is/are formed at the encapsulating layer due to lack of the filling amount.

The present invention has been done in view of the problems as mentioned above, and an object thereof is to provide an encapsulant which can reduce warp and prevent from failure of a filling ability without subjecting to the conventional measure to warp by the filler and adjustment of a resin filling amount to comply with a number of the faulty device(s) at the time of forming an encapsulating layer, and can manufacture a semiconductor apparatus excellent in heat resistance and humidity resistance; an encapsulated substrate having semiconductor devices mounting thereon or an encapsulated wafer having semiconductor devices forming thereon using the encapsulant; a semiconductor apparatus formed by these and a method for manufacturing the same.

To accomplish the above-mentioned objects, in the present invention, it is provided an encapsulant for collectively encapsulating a semiconductor devices mounting surface of a substrate having semiconductor devices mounting thereon or a semiconductor devices forming surface of a wafer having semiconductor devices forming thereon, and the encapsulant comprises a supporting substrate having a difference of a linear expansion coefficient (ppm/° C.) from that of the above-mentioned substrate or the above-mentioned wafer of 5 ppm or less and a thermosetting resin layer being laminated, wherein the above-mentioned thermosetting resin layer has a shape having a height difference to a thickness direction.

Thus, by using the encapsulant comprising a supporting substrate having a difference of a linear expansion coefficient from that of the substrate having semiconductor devices mounting thereon or the wafer having semiconductor devices forming thereon of 5 ppm or less, and a thermosetting resin layer which has a shape having a height difference to a thickness direction being laminated, the semiconductor devices mounting surface of the substrate having the semiconductor devices mounting thereon or the semiconductor devices forming surface of the wafer having the semiconductor devices forming thereon and the thermosetting resin layer-laminated surface of the encapsulant are collectively encapsulated in the form of opposing to each other, so that shrinkage stress of the thermosetting resin layer at the time of encapsulating and curing can be restrained by the function of the supporting substrate. Thus, even when a large diameter wafer or a large sized substrate is encapsulated, warp of the substrate or the wafer, and delamination of the semiconductor devices from the substrate can be suppressed, and, by the height difference of the thermosetting resin layer, failure of the filling ability can be prevented without subjecting to adjustment of a resin filling amount to comply with a number of the faulty device(s) at the time of forming an encapsulating layer, the semiconductor devices mounting surface of the substrate having the semiconductor devices mounting thereon or the semiconductor devices forming surface of the wafer having the semiconductor devices forming thereon can be collectively encapsulated with a wafer level.

Also, it is preferred that the above-mentioned thermosetting resin layer comprises an uncured or semi-cured thermosetting resin.

If it is such a thermosetting resin layer, failure of the filling ability at the collective encapsulating can be more effectively prevented.

Further, the above-mentioned thermosetting resin layer preferably contains either of an epoxy resin, a silicone resin and an epoxy-silicone mixed resin each of which solidifies at lower than 50° C., and melts at 50° C. or higher and 150° C. or lower.

If it is such a thermosetting resin layer, suppression of shrinkage stress by the supporting substrate at the time of encapsulating and curing can be more effectively performed.

Also, a thickness of the above-mentioned thermosetting resin layer is preferably 20 µm or more and 2,000 µm or less.

If the thickness of the thermosetting resin layer is 20 µm or more, occurrence of failure of the filling ability can be more suppressed, while if it is 200 µm or less, it can suppress the semiconductor apparatus to be excessively thick.

Further, a contact area of the above-mentioned thermosetting resin layer and the above-mentioned supporting substrate is preferably 20 to 100% based on an area of the contact surface of the above-mentioned supporting substrate.

By setting the contact area of the thermosetting resin layer and the supporting substrate to such a value, excessively thickening of the thermosetting resin layer at the time of lamination can be more suppressed.

Moreover, the present invention provides an encapsulated substrate having semiconductor devices mounting thereon or an encapsulated wafer having semiconductor devices forming thereon, wherein the substrate having the semiconductor devices mounting thereon or the wafer having the semiconductor devices forming thereon is collectively encapsulated with the encapsulant by covering a semiconductor devices mounting surface of the substrate having the semiconductor devices mounting thereon or a semiconductor devices forming surface of the wafer having the semiconductor devices forming thereon with the thermosetting resin layer of the encapsulant and heating and curing the thermosetting resin layer.

Such an encapsulated substrate having semiconductor devices mounting thereon or an encapsulated wafer having semiconductor devices forming thereon gives an encapsulated substrate having semiconductor devices mounting thereon or an encapsulated wafer having semiconductor devices forming thereon in which warp of the substrate or the wafer or delamination of the semiconductor devices from the substrate can be suppressed and failure of the filling ability of the encapsulating layer is prevented.

Also, the present invention provides a semiconductor apparatus obtained by dicing the above-mentioned encapsulated substrate having semiconductor devices mounting thereon or the above-mentioned encapsulated wafer having semiconductor devices forming thereon into each piece.

Such a semiconductor apparatus becomes a semiconductor apparatus in which warp of the substrate or the wafer or delamination of the semiconductor devices from the substrate can be suppressed and failure of the filling ability of the encapsulating layer is prevented.

Further, the present invention provides a method for manufacturing a semiconductor apparatus which comprises the steps of a covering step of covering the semiconductor devices mounting surface of the substrate having semiconductor devices mounting thereon or the semiconductor devices forming surface of the wafer having semiconductor devices forming thereon by the thermosetting resin layer possessed by the encapsulant e of the present invention, an encapsulating step of collectively encapsulating the above-mentioned semiconductor devices mounting surface of the substrate having the semiconductor devices mounting thereon or the above-mentioned semiconductor devices forming surface of the wafer having semiconductor devices forming thereon by heating and curing the above-mentioned thermosetting resin layer to provide an encapsulated substrate having semiconductor devices mounting thereon or an encapsulated wafer having semiconductor devices forming thereon, and a piece forming step of dicing the encapsulated substrate having semiconductor devices mounting thereon or the encapsulated wafer having semiconductor devices forming thereon into each piece to manufacture the semiconductor apparatus.

If such a method for manufacturing a semiconductor apparatus is employed, even when faulty semiconductor device is removed, it is not necessary to adjust an amount of the resin to be filled every time, a substrate or a wafer and an encapsulating layer can be certainly collectively encapsulated without generating a failure of the filling ability such as voids. Also, when a large sized substrate is encapsulated, warp or crack of the substrate after encapsulating can be suppressed. Further, it is possible to carry out collective encapsulating with a wafer level.

Also, the above-mentioned covering step is preferably carried out by compression molding or vacuum lamination.

By carrying out the covering step by such a method, a substrate or a wafer and an encapsulating layer can be certainly collectively encapsulated without generating a failure of the filling ability.

Further, the above-mentioned covering step preferably has a resin filling step of filling inside of the cavity for forming the encapsulating layer by using an encapsulant on which a thermosetting resin layer with an amount larger than the amount necessary for forming the encapsulating layer has been laminated, and of discharging the excessive thermosetting resin outside the cavity.

By adding such a step, a substrate or a wafer and an encapsulating layer can be collectively encapsulated without adjusting a resin amount to be filled.

Moreover, in the above-mentioned covering step, it is preferred that the above-mentioned thermosetting resin is molded by reducing the pressure of an atmosphere inside the above-mentioned cavity.

By employing such a constitution, a substrate or a wafer and an encapsulating layer can be further certainly collectively encapsulated without generating a failure of the filling ability.

As explained above, according to the encapsulant of the present invention, since the supporting substrate having a difference of a linear expansion coefficient from that of the substrate having semiconductor devices mounting thereon or the wafer having semiconductor devices forming thereon of 5 ppm or less can suppress the shrinkage stress of the thermosetting resin layer at the time of curing and encapsulating, occurrence of warp of the substrate or the wafer or delamination of the semiconductor devices from the substrate can be suppressed even when a large-diameter wafer or a large sized substrate is encapsulated. Also, by using the thermosetting resin layer which has a shape having a height difference to the thickness direction, failure of the filling ability can be prevented without carrying out adjustment of the filling amount of the resin depending on a number of the faulty device(s) at the time of forming the encapsulating layer, and the semiconductor devices mounting surface of the substrate having the semiconductor devices mounting thereon or the semiconductor devices forming surface of the wafer having the semiconductor devices forming thereon can be collectively encapsulated. Further, after encapsulating, it becomes an encapsulant having excellent encapsulating properties such as heat resistance and humidity resistance, and has very high general versatility. Moreover, a semiconductor apparatus in which the substrate having semiconductor devices mounting thereon and the wafer having semiconductor devices forming thereon after collectively encapsulating is divided into each piece has high qualities. In addition, according to the method for manufacturing a semiconductor apparatus using the encapsulant, a semiconductor apparatus having high qualities without void can be manufactured.

DESCRIPTION OF THE PREFERRED EMBODIMENTS

Figure 1:
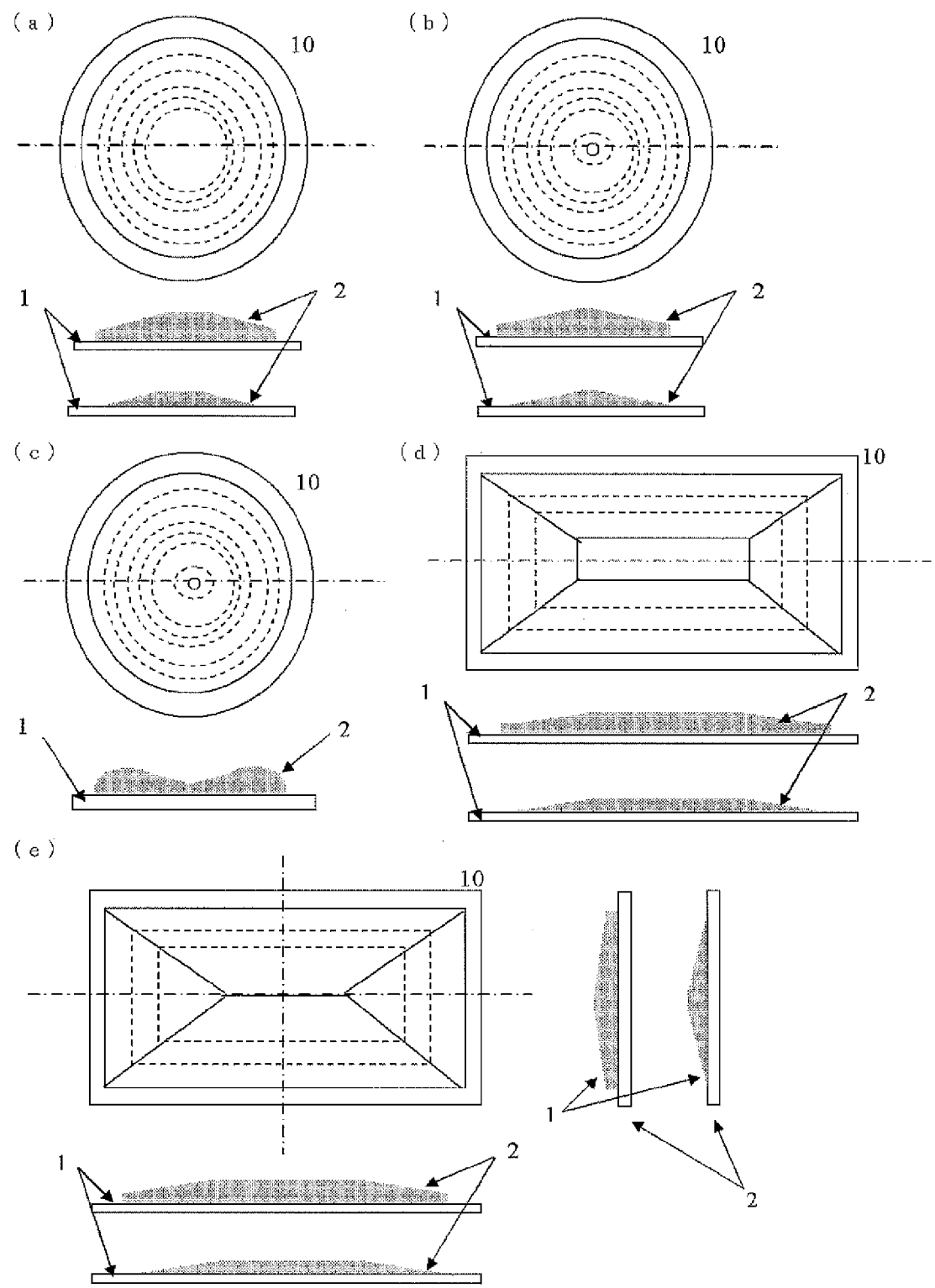
FIG. 1 is an example of a schematic drawing showing an encapsulant of the present invention.

In the following, an encapsulant, an encapsulated substrate having semiconductor devices mounting thereon and an encapsulated wafer having semiconductor devices forming thereon encapsulated by the encapsulant, a semiconductor apparatus manufactured by these, and a method for manufacturing the same of the present invention are explained in detail, but the present invention is not limited by these.

As mentioned above, there has been demanded a highly versatile encapsulant that can suppress occurrence of warp of the substrate or the wafer or delamination of the semiconductor devices from the substrate even when a large sized substrate having semiconductor devices mounting thereon or a large diameter wafer having semiconductor devices forming thereon is encapsulated, can prevent from failure of the filling ability without carrying out adjustment of the filling amount of the resin depending on a number of the faulty device(s), can collectively encapsulate the semiconductor devices mounting surface of the substrate having the semiconductor devices mounting thereon or the semiconductor devices forming surface of the wafer having the semiconductor devices forming thereon, and has excellent encapsulating properties such as heat resistance or moisture resistance after encapsulating.

The present inventors have intensively studied to accomplish the above-mentioned problems, and as a result, they have found that in an encapsulant in which a thermosetting resin layer is laminated to a supporting substrate having a difference in an expansion coefficient from that of the substrate having semiconductor devices mounting thereon or the wafer having semiconductor devices forming thereon of 5 ppm or less, if it is an encapsulant wherein the thermosetting resin layer has a shape having a height difference to a thickness direction, a shrinkage stress of the thermosetting resin layer at the time of curing and encapsulating can be suppressed. By the effect of suppressing the shrinkage stress, they have found that even when a large diameter wafer or a large sized substrate is encapsulated, that warp of the substrate or the wafer or delamination of the semiconductor devices from the substrate can be suppressed, that failure of the filling ability can be prevented without carrying out adjustment of the filling amount of the resin depending on a number of the faulty device(s), that the semiconductor devices mounting surface of the substrate having the semiconductor devices mounting thereon or the semiconductor devices forming surface of the wafer having the semiconductor devices forming thereon and the thermosetting resin layer laminated surface of the encapsulant of the present invention can be collectively encapsulated in the form of opposing to each other, and that it has excellent encapsulating properties such as heat resistance or moisture resistance after encapsulating to give a highly versatile encapsulant, whereby they have accomplished the encapsulant of the present invention.

Also, the present inventors have found that the encapsulated substrate having semiconductor devices mounting thereon and the encapsulated wafer having semiconductor devices forming thereon collectively encapsulated by the above-mentioned encapsulant gives an encapsulated substrate having semiconductor devices mounting thereon and an encapsulated wafer having semiconductor devices forming thereon in which occurrence of warp of the substrate or the wafer or delamination of the semiconductor devices from the substrate can be suppressed, and further that, the encapsulated substrate having semiconductor devices mounting thereon and the encapsulated wafer having semiconductor devices forming thereon suppressed in warp or delamination of the semiconductor devices is divided into each piece, to obtain a semiconductor apparatus having high quality, whereby they have accomplished the encapsulated substrate having semiconductor devices mounting thereon, the encapsulated wafer having semiconductor devices forming thereon and the semiconductor apparatus of the present invention.

Moreover, the present inventors have found that the semiconductor devices mounting surface or the semiconductor devices forming surface can be simply and easily covered by using the above-mentioned encapsulant, that the semiconductor devices mounting surface or the semiconductor devices forming surface can be collectively encapsulated by heating and curing the curable resin layer of the encapsulant without occurrence of voids, and further that, the encapsulated substrate having semiconductor devices mounting thereon or the encapsulated wafer having semiconductor devices forming thereon in which warp or delamination of the semiconductor devices can be suppressed and encapsulated by the encapsulant excellent in encapsulating properties thus obtained is subjected to dicing into each piece to manufacture the semiconductor apparatus having high qualities, whereby they have accomplished the method for manufacturing a semiconductor apparatus of the present invention.

That is, the encapsulant of the present invention is an encapsulant for collectively encapsulating a semiconductor devices mounting surface of a substrate having a semiconductor device mounting thereon or a semiconductor devices forming surface of a wafer having a semiconductor device forming thereon, and in the encapsulant in which a supporting substrate having a difference of a linear expansion coefficient (ppm/° C.) from that of the substrate or the wafer of 5 ppm or less and a thermosetting resin layer are laminated, wherein the thermosetting resin layer has a shape having a height difference to a thickness direction <Supporting Substrate>

The supporting substrate to be used for the encapsulant of the present invention has a difference of a linear expansion coefficient from that of the substrate having semiconductor devices mounting thereon or the wafer having semiconductor devices forming thereon which is an object to be encapsulated, particularly a difference of a linear expansion coefficient by the temperature (including secondary curing) for curing the thermosetting resin layer to be laminated mentioned below of 5 ppm or less, preferably 3 ppm or less, more preferably 2 ppm or less.

The above-mentioned expansion coefficient means an expansion coefficient in the X-Y direction, and shows an expansion coefficient measured by optionally setting an X axis and a Y axis in the plane direction of the supporting substrate, the substrate having semiconductor devices mounting thereon and the semiconductor devices forming wafer.

By making the difference of the expansion coefficient 5 ppm or less, warp by the shrinkage stress at the time of curing the thermosetting resin layer can be suppressed, so that even when a large diameter wafer or a large sized substrate is encapsulated by the encapsulant of the present invention, warp of the substrate or the wafer or delamination of the semiconductor devices from the substrate or the wafer can be suppressed.

A material usable as the supporting substrate is not particularly limited, and an inorganic substrate, a metal substrate or an organic resin substrate can be used depending on the substrate having semiconductor devices mounting thereon or the semiconductor devices forming wafer, and the like, which is an object to be encapsulated. In particular, when the organic resin substrate is used, in the viewpoint of controlling the expansion coefficient mentioned below, an organic resin substrate containing a fiber substrate may be used.

The inorganic substrate may be mentioned a ceramics substrate, a glass substrate, a silicon wafer, and the like, and the metal substrate may be mentioned a copper or aluminum substrate, and the like, a surface of which has been subjected to insulating treatment as representative ones. The organic resin substrate may be mentioned a resin-impregnated fiber substrate in which a thermosetting resin or a filler, and the like, is impregnated into a fiber substrate, further a resin-impregnated fiber substrate in which the thermosetting resin has been semi-cured or cured, and a resin substrate in which the thermosetting resin, and the like, is molded to a substrate shape. Representative materials thereof may be mentioned a BT (bismaleimide triazine) resin substrate, a glass epoxy substrate, a FRP (fiber reinforced plastic) substrate, and the like.

As a material which can be used as a fiber substrate to be used in the organic resin substrate, there may be mentioned, for example, an inorganic fiber such as carbon fiber, glass fiber, quartz glass fiber, metal fiber, an organic fiber such as aromatic polyamide fiber, polyimide fiber, polyamideimide fiber, and further silicon carbide fiber, titanium carbide fiber, boron fiber, alumina fiber, and the like, and any material can be used in accordance with the product characteristics. Also, the most preferred fiber substrate may be mentioned glass fiber, quartz fiber, carbon fiber, and the like. Among others, glass fiber or quartz glass fiber having high insulation property is preferred as the fiber substrate.

The thermosetting resin to be used for the organic resin substrate may be mentioned a BT resin, an epoxy resin, and the like, or usually used for encapsulating of a semiconductor devices such as an epoxy resin, a silicone resin, and further a mixed resin comprising an epoxy resin and a silicone resin exemplified below, but it is not particularly limited.

When the encapsulant of the present invention is prepared by using a resin-impregnated fiber substrate in which a thermosetting epoxy resin is used as the thermosetting resin to be impregnated into the fiber substrate, or a material in which an epoxy resin is semi-cured after impregnation as a supporting substrate, it is preferred that a thermosetting resin to be used in the uncured or semi-cured thermosetting resin layer formed on one surface of the supporting substrate mentioned below is also an epoxy resin. Thus, the thermosetting resin impregnated into the supporting substrate and the thermosetting resin of the thermosetting resin layer is preferably the same kind of the resin, since when the semiconductor devices mounting surface of the substrate having the semiconductor devices mounting thereon or the semiconductor devices forming surface of the wafer having the semiconductor devices forming thereon is collectively encapsulated, these can be cured simultaneously, and more firm encapsulating function can be accomplished. When a silicone resin is used as the thermosetting resin to be impregnated into the fiber substrate, it is also preferred that the uncured or semi-cured thermosetting resin is similarly a silicone resin.

A thickness of the supporting substrate is preferably 20 µm or more and 1000 µm or less, more preferably 30 µm or more and 500 µm or less in either of the cases of the inorganic substrate, the organic substrate, or the organic resin substrate. A thickness of 20 µm or more is preferred since it can suppress that the material becomes easily deformed, and a thickness of 1,000 µm or less is preferred since it can suppress the semiconductor apparatus itself from becoming too thick.

Such a supporting substrate is important for reducing warp after collectively encapsulating the semiconductor devices mounting surface of the substrate having the semiconductor devices mounting thereon or the semiconductor devices forming surface of the wafer having the semiconductor devices forming thereon, and for reinforcing the substrate on which one or more semiconductor devices are arranged and adhered. Therefore, a hard and rigid supporting substrate is preferred.

<Thermosetting Resin Layer>

The encapsulant of the present invention has a thermosetting resin layer. The thermosetting resin layer preferably comprises an uncured or semi-cured thermosetting resin formed on one surface of the supporting substrate. Such a thermosetting resin layer becomes a resin layer for encapsulating.

A thickness of the thermosetting resin layer is preferably 20 µm or more and 2,000 µm or less. A thickness of 20 µm or more is preferred since it is sufficient for encapsulating the semiconductor devices mounting surface of the substrate having the semiconductor devices mounting thereon or the semiconductor devices forming surface of the wafer having the semiconductor devices forming thereon, and it can suppress to cause failure of the filling ability due to too thin, and a thickness of 2,000 µm or less is preferred since it can suppress the encapsulated substrate having semiconductor devices mounting thereon and the encapsulated wafer having semiconductor devices forming thereon becomes too thick.

The thermosetting resin layer is not specifically limited, and it is preferably a thermosetting resin layer comprising a liquid epoxy resin or a solid epoxy resin, a silicone resin, or a mixed resin comprising an epoxy resin and a silicone resin, which are generally used for encapsulating semiconductor devices. In particular, it is preferred to contain either of an epoxy resin, a silicone resin, or an epoxy-silicone mixed resin which solidifies at lower than 50° C., and melts at 50° C. or higher and 150° C. or lower.

[Epoxy Resin]

The epoxy resin is not particularly limited, and may be mentioned, for example, a conventionally know epoxy resin which is a liquid or a solid at room temperature (25° C.) including a bisphenol type epoxy resin such as a bisphenol A type epoxy resin and a bisphenol F type epoxy resin; a biphenol type epoxy resin such as 3,3',5,5'-tetramethyl-4,4'-biphenol type epoxy resin and 4,4'-biphenol type epoxy resin; a novolac type epoxy resin such as a phenol novolac type epoxy resin, a cresol novolac type epoxy resin and a bisphenol A novolac type epoxy resin; naphthalenediol type epoxy resin, trisphenylolmethane type epoxy resin, tetrakisphenylolethane type epoxy resin, an epoxy resin in which an aromatic ring of a phenol dicyclopentadiene novolac type epoxy resin is hydrogenated, an alicyclic epoxy resin, and the like. Also, depending on necessity, an epoxy resin other than the above-mentioned may be used in combination with a certain amount within the range which does not impair the effects of the present invention.

The thermosetting resin layer comprising an epoxy resin becomes a resin layer for encapsulating the semiconductor devices, so that an amount of a halogen ion such as chlorine and an alkali ion such as sodium is preferably reduced as much as possible. As a method for reducing an amount of each ion, there may be mentioned a method in which 10 g of a sample is added to 50 ml of deionized water, the mixture is encapsulated and allowed to stand in an oven at 120° C. for 20 hours, and then, extracted under heating, and an amount of each ion is preferably 10 ppm or less by the extraction at 120° C.

To the thermosetting resin layer comprising the epoxy resin may be further added a curing agent of the epoxy resin. Such a curing agent may be mentioned a phenol resin such as a phenol novolac resin, various kinds of amine derivatives, a material in which part of an acid anhydride or an acid anhydride group is ring-opened to form a carboxylic acid, and the like. Among them, a phenol novolac resin is preferred to ensure reliability of the semiconductor apparatus manufactured by using the encapsulant of the present invention. In particular, it is preferred to mix the epoxy resin and the phenol novolac resin with a mixing ratio of the epoxy group and the phenolic hydroxyl group of 1:0.8 to 1.3.

Further, to promote the reaction of the epoxy resin and the curing agent, imidazole derivatives, phosphine derivatives, amine derivatives, metal compounds such as organic aluminum compounds may be added as a reaction accelerator.

To the thermosetting resin layer comprising the epoxy resin, various kinds of additives may be formulated, depending on necessity. For example, there may be mentioned various kinds of additives such as thermoplastic resins, thermoplastic elastomers, organic synthetic rubbers, stress reducers such as a silicone series, waxes, halogen-trapping agents, for the purpose of improving the properties of the resin, and these may be added and formulated within the range which does not impair the effects of the present invention.

[Silicone Resin]

As the silicone resin, for example, a thermosetting silicone resin may be used. In particular, the thermosetting resin layer comprising the silicone resin preferably contains an addition curing type silicone resin composition. The addition curing type silicone resin composition is particularly preferably that containing (A) an organic silicon compound having a non-conjugated double bond, (B) an organohydrogen polysiloxane, and (C) a platinum-based catalyst as essential components. In the following, the Components (A) to (C) are explained.

An organic silicon compound having a non-conjugated double bond of Component (A) acts as a base polymer (main component) of the silicone resin composition, and as Component (A), there may be exemplified by a linear organopolysiloxane having a non-conjugated double bond such as an alkenyl group at the both-terminals of the molecular chain:

$$R^1R^2R^3SiO-(R^4R^5SiO)_a-(R^6R^7SiO)_b-SiR^1R^2R^3 \quad (1)$$

wherein $R^1$ represents a monovalent hydrocarbon group having a non-conjugated double bond, each $R^2$ to $R^7$ may be the same or different and represent a monovalent hydrocarbon group, "a" and "b" are integers satisfying $0 \leq a \leq 500$, $0 \leq b \leq 250$, and $0 \leq a+b \leq 500$.

In the above-mentioned formula (1), $R^1$ represents a monovalent hydrocarbon group having a non-conjugated double bond, and preferably a monovalent hydrocarbon group having a non-conjugated double bond having an aliphatic unsaturated bond represented by an alkenyl group having 2 to 8 carbon atoms, particularly preferably 2 to 6 carbon atoms.

In the above-mentioned formula (1), each $R^2$ to $R^7$ may be the same or different and represent a monovalent hydrocarbon group, and preferably mentioned are an alkyl group, an alkenyl group, an aryl group and an aralkyl group having 1 to 20 carbon atoms, particularly preferably 1 to 10 carbon atoms, and the like. Also, among these, $R^4$ to $R^7$ are more preferably a monovalent hydrocarbon group except for an aliphatic unsaturated bond, particularly preferably an alkyl group, an aryl group, and an aralkyl group each having no aliphatic unsaturated bond such as an alkenyl group, and the like. Further, $R^6$ and $R^7$ among these are preferably an aromatic monovalent hydrocarbon group, particularly preferably an aryl group having 6 to 12 carbon atoms such as a phenyl group and a tolyl group, and the like.

In the above-mentioned formula (1), "a" and "b" are integers satisfying $0 \leq a \leq 500$, $0 \leq b \leq 250$, and $0 \leq a+b \leq 500$, a preferably satisfies $10 \leq a \leq 500$, particularly preferably $10 \leq a \leq 250$, b preferably satisfies $0 \leq b \leq 150$, particularly preferably $0 \leq b \leq 100$, and a+b preferably satisfies $10 \leq a+b \leq 500$, particularly preferably $10 \leq a+b \leq 250$.

The organopolysiloxane represented by the above-mentioned formula (1) can be obtained by, for example, an alkali equilibrium reaction of a cyclic diorganopolysiloxane such as a cyclic diphenylpolysiloxane, a cyclic methylphenylpolysiloxane, and a disiloxane such as diphenyltetravinyldisiloxane, divinyltetraphenyldisiloxane, which constitutes a terminal group. In this case, in the equilibrium reaction by an alkali catalyst (in particular, strong alkali such as KOH.), polymerization proceeds with a small amount of the catalyst with an irreversible reaction, and ring-opening polymerization alone proceeds quantitatively and a terminal encapsulating ratio is high, so that a silanol group and a chlorine component are generally not contained.

The organopolysiloxane represented by the above-mentioned formula (1) may be specifically exemplified by the following.

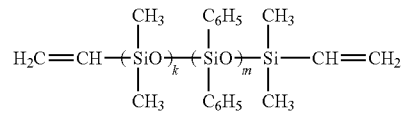

-continued

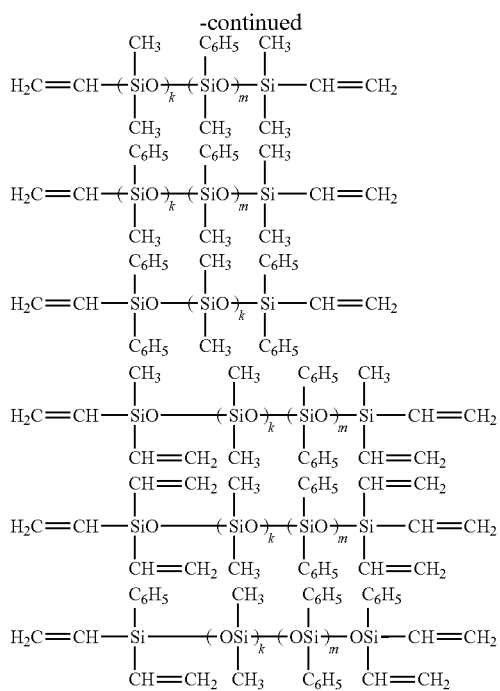

In the above-mentioned formulae, "k" and "m" are integers satisfying $0 \leq k \leq 500$, particularly $5 \leq k \leq 250$, $0 \leq m \leq 250$, particularly $0 \leq m \leq 100$, and $0 \leq k+m \leq 500$, preferably $5 \leq k+m \leq 250$, more preferably $10 \leq k+m \leq 250$, and $0 \leq m/(k+m) \leq 0.5$.

Component (A) is, in addition to the organopolysiloxane having a linear structure represented by the above-mentioned formula (1), an organopolysiloxane having a three dimensional network structure including a branched structure such as a trifunctional siloxane unit and a tetrafunctional siloxane unit, may be used in combination, if necessary. Such an organic silicon compound having a non-conjugated double bond may be used a single kind alone or may be used two or more kinds in admixture.

An amount of the group having a non-conjugated double bond (a monovalent hydrocarbon group having a double bond bonded to the Si atom) in the organic silicon compound having a non-conjugated double bond of Component (A) is preferably 1 to 50 mol % based on the whole monovalent hydrocarbon groups (whole monovalent hydrocarbon groups bonded to the Si atom), more preferably 2 to 40 mol %, particularly preferably 5 to 30 mol %. If the amount of the group having a non-conjugated double bond is 1 mol % or more, good cured product can be obtained when it is cured, while if it is 50 mol % or less, mechanical characteristics when it is cured are good so that it is preferred.

Also, the organic silicon compound having a non-conjugated double bond of Component (A) preferably has an aromatic monovalent hydrocarbon group (an aromatic monovalent hydrocarbon group bonded to the Si atom), and a content of the aromatic monovalent hydrocarbon group is preferably 0 to 95 mol % based on the whole monovalent hydrocarbon group (whole monovalent hydrocarbon groups bonded to the Si atom), more preferably 10 to 90 mol %, particularly preferably 20 to 80 mol %. When the aromatic monovalent hydrocarbon group is contained in the resin with a suitable amount, there are merits that mechanical characteristics at the time of curing are good and a preparation thereof can be easily carried out.

Component (B): Organohydrogen Polysiloxane

Component (B) is preferably an organohydrogen polysiloxane having 2 or more hydrogen atoms bonded to the silicon atom (SiH groups) in the molecule, particularly 3 or more, above all, those having about 3 to 50. If it is an organohydrogen polysiloxane having 2 or more hydrogen atoms bonded to the silicon atom (SiH groups) in the molecule, it acts as a cross-linking agent, and a SiH group in Component (B) and a non-conjugated double bond-containing group such as a vinyl group, an alkenyl group, of Component (A) are subjected to an addition reaction whereby a cured product can be formed more simply and easily.

Also, the organohydrogen polysiloxane of Component (B) acts as a cross-linking agent (curing agent) of the silicone resin composition and as the organohydrogen polysiloxane of Component (B) is preferably, an aromatic monovalent hydrocarbon group, particularly preferably having an aryl group such as a phenyl group. If it is an organohydrogen polysiloxane having an aromatic monovalent hydrocarbon group as mentioned above, compatibility with the above-mentioned Component (A) can be heightened. Such an organohydrogen polysiloxane may be used a single kind alone or may be used two or more kinds in admixture, and, for example, the organohydrogen polysiloxane having an aromatic hydrocarbon group can be contained as a part or whole of Component (B).

Component (B) is not particularly limited, and may be mentioned 1,1,3,3-tetramethyldisiloxane, 1,3,5,7-tetramethylcyclotetrasiloxane, tris(dimethylhydrogensiloxy)-methylsilane, tris(dimethylhydrogensiloxy)phenylsilane, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, both-terminals trimethylsiloxy group-blocked methylhydrogenpolysiloxane, both-terminals trimethylsiloxy group-blocked dimethylsiloxane.methylhydrogensiloxane copolymer, both-terminals dimethylhydrogensiloxy group-blocked dimethylpolysiloxane, both-terminals dimethylhydrogensiloxy group-blocked dimethylsiloxane.methylhydrogensiloxane copolymer, both-terminals trimethylsiloxy group-blocked methyl-hydrogensiloxane.diphenylsiloxane copolymer, both-terminals trimethylsiloxy group-blocked methylhydrogensiloxane.diphenylsiloxane.dimethylsiloxane copolymer, trimethoxysilane polymer, a copolymer comprising a $(CH_3)_2HSiO_{1/2}$ unit and a $SiO_{4/2}$ unit, and a copolymer comprising a $(CH_3)_2HSiO_{1/2}$ unit, a $SiO_{4/2}$ unit and a $(C_6H_5)SiO_{3/2}$ unit, and the like.

Also, an organohydrogen polysiloxane obtained by using the unit represented by the following structure may be used.

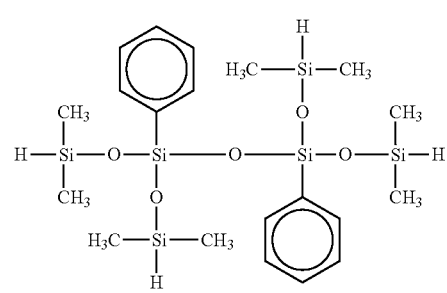

-continued

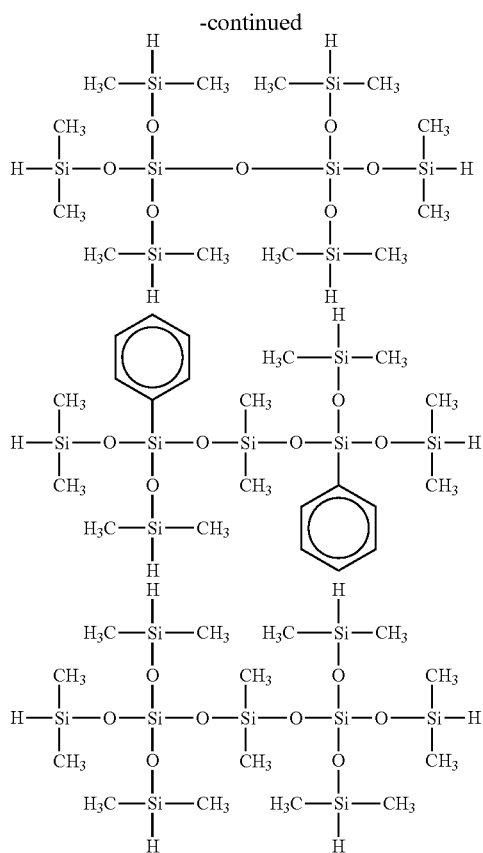

A molecular structure of the organohydrogen polysiloxane of Component (B) may be either of a linear, a cyclic, a branched or a three dimensional network structure, and a number of the silicon atom in one molecule (or a polymerization degree in the case of a polymer) is preferably 2 or more, more preferably 2 to 1,000, and particularly preferably those of about 2 to 300 can be used.

A blending amount of Component (B) is preferably an amount that the hydrogen atom bonded to the silicon atom (SiH group) in Component (B) is 0.7 to 3.0 based on one group having a non-conjugated double bond such as an alkenyl group of Component (A).

Component (C): Platinum-Based Catalyst

Component (C) may be mentioned, for example, chloroplatinic acid, an alcohol-modified chloroplatinic acid, a platinum complex having a chelate structure, and the like. These may be used a single kind alone or may be two or more kinds in combination.

A formulation amount of Component (C) is an effective amount for curing which may be the so-called catalytic amount, and in general, per 100 parts by mass of the total mass of Component (A) and Component (B), it is preferably in terms of mass of the platinum group metal of 0.1 to 500 ppm, particularly preferably in the range of 0.5 to 100 ppm.

The thermosetting resin layer comprising the silicone resin becomes a resin layer for encapsulating the semiconductor devices, so that an amount of a halogen ion such as chlorine and an alkali ion such as sodium is preferably reduced as much as possible. A method for reducing an amount of each ion is the same as that of the epoxy resin, and an amount of each ion is preferably 10 ppm or less by the extraction at 120° C.

[Mixed Resin Comprising Epoxy Resin and Silicone Resin]

The epoxy resin and the silicone resin contained in the mixed resin comprising the epoxy resin and the silicone resin may be mentioned those as mentioned above.

The thermosetting resin layer comprising the mixed resin which comprises the epoxy resin and the silicone resin becomes a resin layer for encapsulating the semiconductor devices, so that an amount of a halogen ion such as chlorine and an alkali ion such as sodium are preferably reduced as much as possible. A method for reducing an amount of each ion is the same as that of the epoxy resin and the silicone resin, and an amount of each ion is preferably 10 ppm or less by the extraction at 120° C.

[Inorganic Filler]

In the thermosetting resin layer according to the present invention, inorganic filler may be further formulated depending on necessity. The inorganic filler to be formulated may be mentioned, for example, silicas such as fused silica, crystalline silica, alumina, silicon nitride, aluminum nitride, aluminosilicate, boron nitride, glass fiber, antimony trioxide, and the like. An average particle diameter or a shape of these inorganic fillers is not particularly limited.

In particular, an inorganic filler to be added to the thermosetting resin layer comprising the epoxy resin may be mentioned a material a surface of which is previously treated by a coupling agent such as a silane coupling agent (for example, an alkoxysilane and/or a partial hydrolysis condensate thereof having a monovalent hydrocarbon group substituted by a functional group such as an alkenyl group, an epoxy group, a (meth)acryloxy group, a mercapto group, an ureido group.), a titanate coupling agent, and the like, to strengthen the bond strength of the epoxy resin and the inorganic filler.

Such a coupling agent preferably used may be mentioned, for example, an epoxy-functional alkoxysilane such as γ-glycidoxypropyltrimethoxysilane, γ-glycidoxy-propylmethyldiethoxysilane and β-(3,4-epoxycyclohexyl)-ethyltrimethoxysilane; an amino-functional alkoxysilane such as N-β(aminoethyl)-γ-aminopropyltrimethoxysilane, γ-aminopropyltriethoxysilane and N-phenyl-γ-aminopropyltrimethoxysilane; and a mercapto-functional alkoxysilane such as γ-mercaptopropyltrimethoxysilane. Incidentally, a formulation amount of the coupling agent to be used for the surface treatment and a method of the surface treatment are not particularly limited.

In case of adding to the thermosetting resin layer comprising the silicone resin composition, a material a surface of the inorganic filler is treated by the above-mentioned coupling agent may be formulated.

A formulation amount of the inorganic filler is preferably 100 to 1,300 parts by mass, particularly preferably 200 to 1,000 parts by mass based on 100 parts by mass of the total mass of the resin in the epoxy resin composition or the silicone resin composition. If it is 100 parts by mass or more, sufficient strength can be obtained, while if it is 1,300 parts by mass or less, lowering in fluidity due to increase in viscosity can be suppressed, failure of the filling ability due to lowering of fluidity can be suppressed, and as a result, semiconductor devices forming on the wafer and semiconductor devices arranged and mounted on the substrate can be well encapsulated. Incidentally, this inorganic filler is preferably contained in the range of 50 to 95% by mass, particularly 60 to 90% by mass based on the whole composition constituting the thermosetting resin layer.

<Encapsulant>

Figure 2:
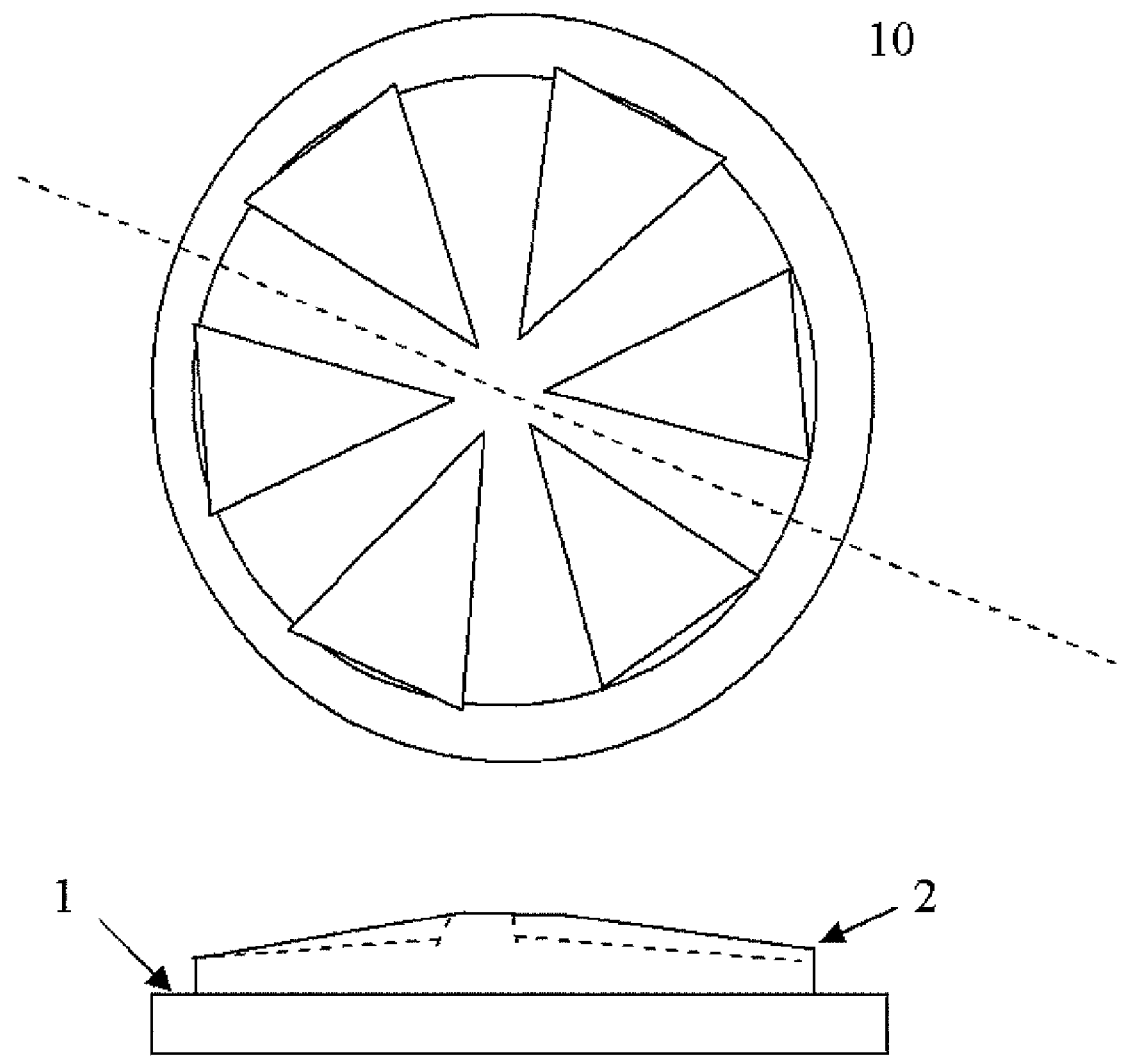
FIG. 2 is other example of a schematic drawing showing an encapsulant of the present invention.

An example of the schematic drawing of the encapsulant of the present invention is shown in FIG. 1 and FIG. 2. The encapsulant 10 of the present invention is a material laminating the supporting substrate 1 and the thermosetting resin layer 2 having a height difference to a thickness direction.

The thermosetting resin layer according to the present invention has a shape having a height difference to a thickness direction. FIG. 1(*a*) to (*e*) and FIG. 2 show an example of the shape having a height difference. Examples of such a shape may preferably include a shape in which the center portion is particularly high as compared with the peripheral portion, but a shape in which the center portion is low as compared with the peripheral portion is also acceptable.

By making the shape as mentioned above, it is possible to exclude voids which are likely involved in the thermosetting resin layer outside the encapsulating area with good efficiency, when the semiconductor devices mounting surface of the substrate having the semiconductor devices mounting thereon or the semiconductor devices forming surface of the wafer having the semiconductor devices forming thereon and the thermosetting resin layer-laminated surface of the encapsulant are collectively encapsulated in the form of opposing to each other by using the encapsulant.

A contact area of the thermosetting resin layer and the supporting substrate is preferably 20 to 100%, more preferably 40 to 100% based on the area of the contact surface of the supporting substrate.

The contact area of the thermosetting resin layer and the supporting substrate is preferably 20% or more based on the area of the contact surface of the supporting substrate since the thermosetting resin layer never becomes too thick when the resin is laminated with an amount necessary for encapsulating the substrate having semiconductor devices mounting thereon or the semiconductor devices forming wafer, and the semiconductor devices mounting surface or the semiconductor devices forming surface can be filled uniformly.

[Manufacturing Method of Encapsulant]

For manufacturing the encapsulant of the present invention, when the thermosetting resin layer is laminated to the supporting substrate, the thermosetting resin layer having a height difference to a thickness direction can be formed, for example, by the method of compression molding the thermosetting resin using a mold, and the like, or the method of forming the thermosetting resin by printing or laminating sheet state or film state resins having different sizes, and the like. In the following, a manufacturing method of the encapsulant is exemplified. In either of the methods, a treatment to form a shape having a height difference to a thickness direction is applied to the thermosetting resin layer.

On one surface of the supporting substrate, an uncured or semi-cured thermosetting resin layer can be formed by laminating an uncured thermosetting resin in a sheet state or a film state and by using vacuum lamination, high temperature vacuum press or heated roll, and the like.

Also, on one surface of the supporting substrate, the thermosetting resin layer which is a solid at 50° C. or lower can be formed by coating a thermosetting resin such as a liquid state epoxy resin or silicone resin, under reduced pressure or under vacuum by printing or dispensing, and so on, and heating.

Further, on one surface of the supporting substrate, an uncured or semi-cured thermosetting resin layer can be formed by various kinds of methods which have been conventionally used in the epoxy resin or silicone resin, and the like, by subjecting an uncured thermosetting resin by press molding, printing, and so on.

As the other methods, an uncured or semi-cured thermosetting resin layer can be formed on one surface of the supporting substrate by the method in which an epoxy resin or a silicone resin, and the like, which is a solid at room temperature is pressurized while heating, or the method in which a suitable amount of a polar solvent such as acetone, and the like, is added to an epoxy resin composition to liquefy the mixture, a thin film is formed by printing, and so on, and the solvent is removed by heating under reduced pressure, and so on.

In either of the methods, on one surface of the supporting substrate, the thermosetting resin layer with a shape having a height difference to a thickness direction can be formed, which layer contains no void or volatile component, and comprises an uncured or semi-cured thermosetting resin with a thickness of 20 μm or more and 2,000 μm or less.

Further, other embodiment of a manufacturing method of the encapsulant is explained below.

When the supporting substrate is an organic substrate, and as the organic substrate, a resin-impregnated fiber substrate in which a thermosetting resin has been impregnated into the fiber substrate, or further, the thermosetting resin has been semi-cured is used, the thermosetting resin to be impregnated into the fiber substrate and the thermosetting resin of an uncured or semi-cured thermosetting resin layer formed on one surface of the supporting substrate are preferably the same kind of the resin, since the semiconductor devices mounting surface of the substrate having the semiconductor devices mounting thereon or the semiconductor devices forming surface of the wafer having the semiconductor devices forming thereon is collectively encapsulated, these can be cured simultaneously, and more firm encapsulating function can be accomplished as already mentioned above.

Further, when the thermosetting resin to be impregnated into the fiber substrate and the thermosetting resin of an uncured or semi-cured thermosetting resin layer formed on one surface of the supporting substrate are the resin with the same composition, manufacture of the supporting substrate and formation of the thermosetting resin layer may be separately and successively carried out, but to simplify the procedure, manufacture of the supporting substrate and formation of the thermosetting resin layer can be carried out simultaneously.

More specifically, on one surface of the fiber substrate, an uncured thermosetting resin is laminated in a sheet state or a film state, and by using vacuum lamination, high temperature vacuum press or heated roll, and the like, the thermosetting resin is impregnated into the fiber substrate and simultaneously an uncured or semi-cured thermosetting resin layer can be formed.

Also, on one surface of the supporting substrate, the thermosetting resin layer which is a solid at 50° C. or lower can be formed by coating a thermosetting resin such as a liquid state epoxy resin or silicone resin, and the like, under reduced pressure or under vacuum by printing or dispensing, and the like, and after impregnating the thermosetting resin into the fiber substrate, and heating the same.

Further, on one surface of the supporting substrate, according to various kinds of methods which have been conventionally used in the epoxy resin or silicone resin, and the like, an uncured thermosetting resin is subjected to press molding, printing, and the like, to impregnate the thermosetting resin into the fiber substrate, and simultaneously an uncured or semi-cured thermosetting resin layer can be formed.

As the other methods, on one surface of the supporting substrate, according to the method in which an epoxy resin or a silicone resin, and the like, which is a solid at room temperature is pressurized while heating, or the method in which a suitable amount of a polar solvent such as acetone is added to an epoxy resin composition to liquefy the mixture, a thin film is formed by printing, and so on, and the solvent is removed by heating under reduced pressure, and so on, to impregnate the thermosetting resin into the fiber substrate, and simultaneously an uncured or semi-cured thermosetting resin layer can be formed.

In this embodiment, at the portion at which the thermosetting resin has been impregnated into the fiber substrate, after the semiconductor devices mounting surface of the substrate having the semiconductor devices mounting thereon or the semiconductor devices forming surface of the wafer having the semiconductor devices forming thereon is collectively encapsulated and cured, the fiber substrate and the thermosetting resin are selected so that the difference of the expansion coefficient from that of the substrate having semiconductor devices mounting thereon or the wafer having semiconductor devices forming thereon became 5 ppm or less, and the treatment for forming the shape having a height difference to a thickness direction is applied to the thermosetting resin layer, whereby the effects of the present invention can be obtained.

[Semiconductor Devices Mounting Substrate and Semiconductor Devices Forming Wafer]

The encapsulant of the present invention is an encapsulant for collectively encapsulating the semiconductor devices mounting surface of the substrate having the semiconductor devices mounting thereon, and the semiconductor devices forming surface of the wafer having the semiconductor devices forming thereon. The substrate having semiconductor devices mounting thereon may be mentioned, for example, a substrate in which one or more semiconductor devices 3 are mounted on an inorganic, metal or organic substrate 5 by an adhesive 4 shown in FIG. 3(a). Also, the wafer having semiconductor devices forming thereon may be mentioned, for example, a wafer in which semiconductor devices 6 are formed on the wafer 7 shown in FIG. 3(b). Incidentally, the substrate having semiconductor devices mounting thereon includes semiconductor devices array on which semiconductor devices are mounted and arranged, and so on.

<Encapsulated Substrate Having Semiconductor Devices Mounting Thereon and Encapsulated Wafer Having Semiconductor Devices Forming Thereon>

Figure 3:
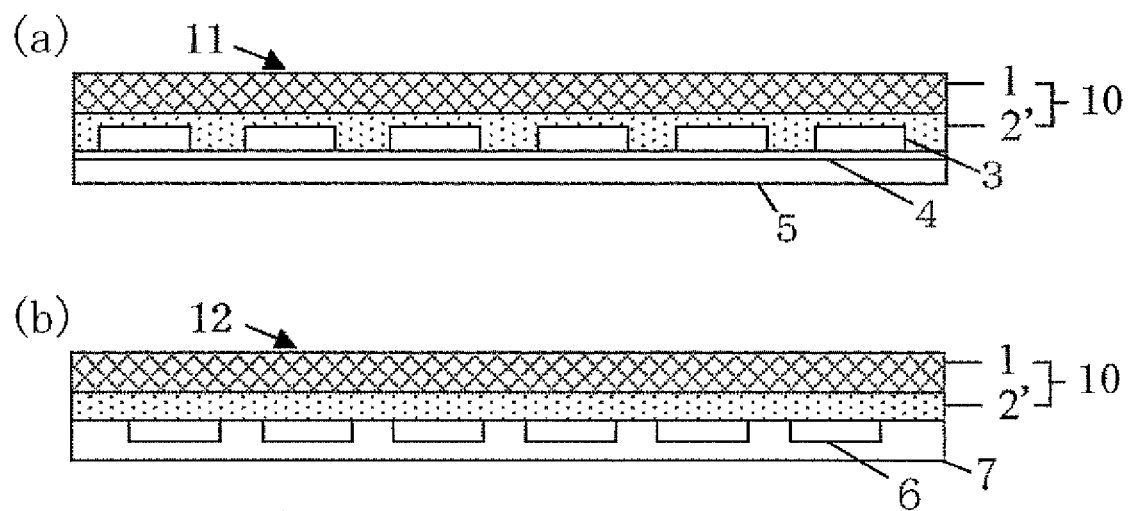
FIG. 3 is an example of a sectional drawing of an encapsulated substrate having semiconductor devices mounting thereon and an encapsulated wafer having semiconductor devices forming thereon of the present invention.

An example of the sectional view of the encapsulated substrate having semiconductor devices mounting thereon and the encapsulated wafer having semiconductor devices forming thereon encapsulated by the encapsulant of the present invention is shown in FIGS. 3(a) and (b). The encapsulated substrate 11 having semiconductor devices mounting thereon of the present invention is a material in which a semiconductor devices mounting surface of a substrate 5 having semiconductor devices 3 mounted thereon is covered by a thermosetting resin layer 2 (see FIG. 1 and FIG. 2) of an encapsulant 10, the thermosetting resin layer 2 (see FIG. 1 and FIG. 2) is heated and cured to prepare a cured resin layer 2', whereby the surface is collectively encapsulated by the encapsulant 10 (FIG. 3(a)). Also, the encapsulated wafer 12 having semiconductor devices forming thereon of the present invention is a material in which a semiconductor devices forming surface of a wafer 7 having semiconductor devices 6 formed thereon is covered by a thermosetting resin layer 2 (see FIG. 1 and FIG. 2) of an encapsulant 10, the thermosetting resin layer 2 (see FIG. 1 and FIG. 2) is heated and cured to prepare a cured resin layer 2', whereby the surface is collectively encapsulated by the encapsulant 10 (FIG. 3(b)).

Thus, when an encapsulated substrate having semiconductor devices mounting thereon or an encapsulated wafer having semiconductor devices forming thereon is a material collectively encapsulated by an encapsulant obtained by covering the semiconductor devices mounting surface of the substrate having the semiconductor devices mounting thereon or the semiconductor devices forming surface of the wafer having the semiconductor devices forming thereon by the thermosetting resin layer of the encapsulant, and heating and curing the thermosetting resin layer, the resulting encapsulated substrate having semiconductor devices mounting thereon or encapsulated wafer having semiconductor devices forming thereon becomes a material which does not occur voids at the thermosetting resin layer after molding, and occurrence of warp of the substrate or the wafer or delamination of the semiconductor devices from the substrate can be suppressed.

<Semiconductor Apparatus>

An example of the semiconductor apparatus of the present invention is shown in FIG. 4(a), (b). A semiconductor apparatus 13 or 14 of the present invention is obtained by dicing the encapsulated substrate 11 having semiconductor devices mounting thereon (see FIG. 3(a)) or the encapsulated wafer 12 having semiconductor devices forming thereon (see FIG. 3(b)) into each piece. Thus, the semiconductor apparatus 13 or the semiconductor apparatus 14 manufactured by encapsulating with the encapsulant having excellent encapsulating properties such as heat resistance and humidity resistance and dicing the encapsulated substrate 11 having semiconductor devices mounting thereon or the encapsulated wafer 12 having semiconductor devices forming thereon in which warp of the substrate or the wafer or delamination of the semiconductor devices 3 from the substrate can be suppressed into each piece, can be a semiconductor apparatus having high quality. When the encapsulated substrate 11 having semiconductor devices mounting thereon is diced into each piece, the resulting semiconductor apparatus 13 can be a semiconductor apparatus in which the semiconductor devices 3 are mounted on the substrate 5 through the adhesive 4, and encapsulated from the above by the encapsulant 10 comprising the cured resin layer 2' and the supporting substrate 1 (FIG. 4(a)). Also, when the above-mentioned encapsulated wafer 12 having semiconductor devices forming thereon is diced into each piece, the resulting semiconductor apparatus 14 can be a semiconductor apparatus in which the semiconductor devices 6 are formed on the wafer 7, and encapsulated from the above by the encapsulant 10 comprising the cured resin layer 2' and the supporting substrate 1 (FIG. 4(b)).

<Method for Manufacturing Semiconductor Device>

The method for manufacturing a semiconductor apparatus of the present invention comprises a covering step of covering a semiconductor devices mounting surface of a substrate having semiconductor devices mounting thereon or a semiconductor devices forming surface of a wafer having semiconductor devices forming thereon with a thermosetting resin layer of the encapsulant, an encapsulating step of collectively encapsulating the semiconductor devices mounting surface of the substrate having the semiconductor devices mounting thereon or the semiconductor devices forming surface of the wafer having the semiconductor devices forming thereon by heating and curing the thermosetting resin layer to provide an encapsulated substrate having the semiconductor devices mounting thereon or an encapsulated wafer having the semiconductor devices forming thereon, and a piece forming step of dicing the encapsulated substrate having the semiconductor devices mounting thereon or the encapsulated wafer having the semiconductor devices forming thereon into each piece to manufacture the semiconductor apparatus.

In the following, each step of the method for manufacturing a semiconductor apparatus according to the present invention will be explained by referring to FIG. 5.

[Covering Step]

Figure 5:
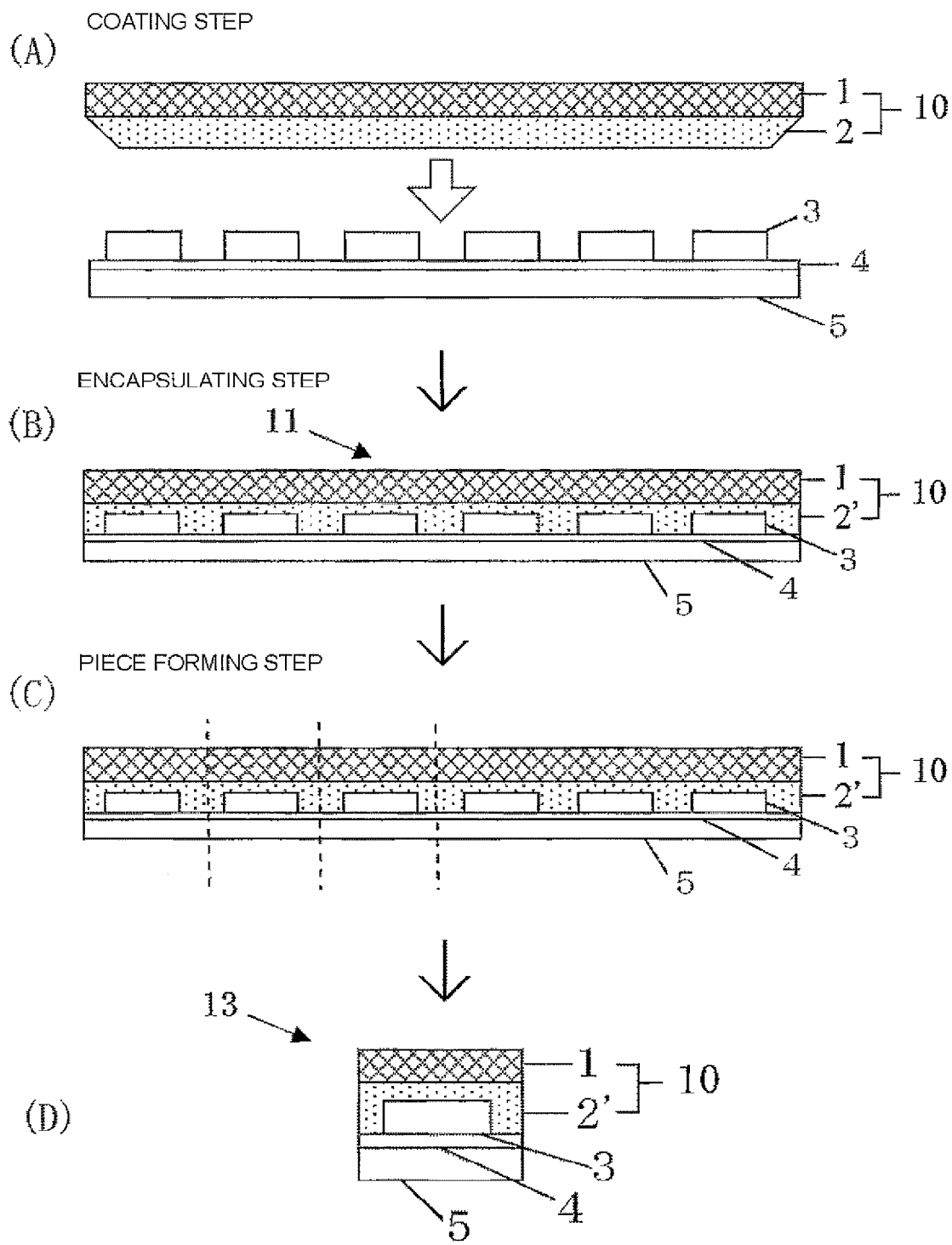
FIG. 5 is an example of a flow chart of the method for the manufacturing a semiconductor apparatus from a substrate on which a semiconductor device is mounted by using an encapsulant of the present invention.

The covering step according to the method for manufacturing a semiconductor apparatus of the present invention is a step of covering the semiconductor devices mounting surface of the substrate 5 having the semiconductor devices 3 mounted thereon or the semiconductor devices forming surface of the wafer (not shown in the figure) having the semiconductor devices (not shown in the figure) formed thereon through the adhesive 4 with the thermosetting resin layer 2 of the encapsulant 10 having the supporting substrate 1 and the thermosetting resin layer 2 (FIG. 5 (A)).

[Encapsulating Step]

The encapsulating step according to the method for manufacturing a semiconductor apparatus of the present invention is a step of heating and curing the thermosetting resin layer 2 of the encapsulant 10 to provide the cured resin layer 2' and thereby collectively encapsulating the semiconductor devices mounting surface of the substrate 5 having each semiconductor device 3 mounted thereon or the semiconductor devices forming surface of the wafer (not shown in the figure) having each semiconductor device (not shown in the figure) formed thereon to provide the encapsulated substrate 11 having semiconductor devices mounting thereon or the encapsulated wafer (not shown in the figure) having semiconductor devices forming thereon (FIG. 5 (B)).

[Piece Forming Step]

Figure 4:
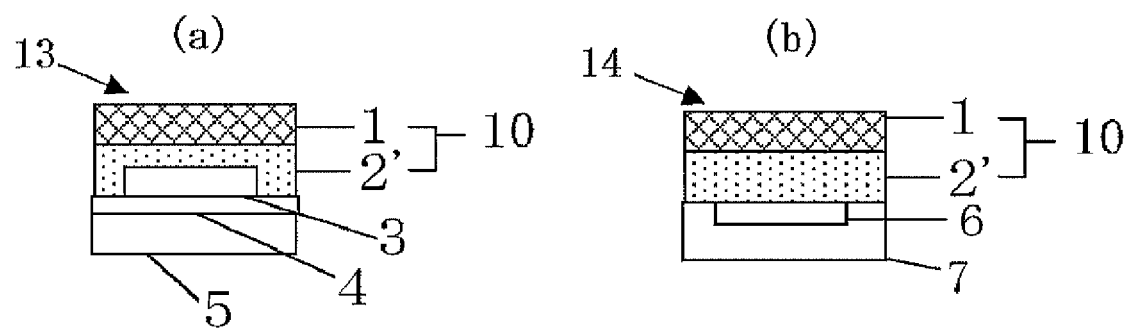
FIG. 4 is an example of the semiconductor apparatus prepared from an encapsulated substrate having semiconductor devices mounting thereon and an encapsulated wafer having semiconductor devices forming thereon of the present invention.

The piece forming step according to the method for manufacturing a semiconductor apparatus of the present invention is a step of dicing the encapsulated substrate 11 having semiconductor devices mounting thereon or an encapsulated wafer (not shown in the figure) having semiconductor devices forming thereon into each piece, thereby manufacturing the semiconductor apparatus 13 or semiconductor apparatus 14 (see FIG. 4(*b*)) (FIGS. 5(C) and (D)).

In the following, it is more specifically explained.

At the covering step and the encapsulating step, generally used compression molding, vacuum lamination, and the like, can be utilized.

As an example of the embodiment of the covering step and the encapsulating step of the present invention, an example of the compression molding is explained.

On the surface of one of an upper mold or a lower mold of a mold having a cavity a room temperature to heated up to 200° C. is provided a metal, inorganic or organic substrate having one or more semiconductor devices mounting thereon or a wafer having semiconductor devices forming thereon, and on the surface of the other mold is provided the encapsulant of the present invention so that the semiconductor devices mounting surface of the substrate having the semiconductor devices mounting thereon or the semiconductor devices forming surface of the wafer having the semiconductor devices forming thereon and the thermosetting resin layer laminated surface of the encapsulant of the present invention are arranged in the form of opposing to each other. Thereafter, the upper and the lower molds are pressurized to carry out the compression molding and the thermosetting resin is cured to integrate the upper and the lower substrates.

At this time, to improve the filling ability to the gaps, an atmosphere in the mold is reduced at the state when the upper and the lower molds are contacted through a packing, and then, the thermosetting resin may be molded. A pressure reduction degree is preferably as low as possible to a level near to vacuum. For example, the degree of vacuum can be 0.01333 to 13.33 KPa (0.1 to 100 Torr).

As the other embodiment of the covering step and the encapsulating step according to the present invention, by using an encapsulant in which a thermosetting resin layer is formed thereon with an excessive amount than the amount of the resin necessary for collectively encapsulating the semiconductor devices mounting surface of the substrate having at least one of the semiconductor devices mounting thereon or the semiconductor devices forming surface of the wafer having the semiconductor devices forming thereon, and at the time of compression molding, the encapsulating step may have a molding mechanism in which the above-mentioned excess thermosetting resin is discharged outside the cavity. According to this constitution, it is possible to always maintain the constant molding shape and expulsion of voids can be effectively carried out irrespective of a quantity of the semiconductor devices to be mounted.

As still further embodiment, at the covering step and the encapsulating step, a vacuum laminator apparatus, and so on, used for lamination of a solder resist film or various kinds of insulator films, and the like, is used, covering and encapsulating without voids and warp can be carried out. As a method of lamination, it is possible to use any methods including roll lamination, diaphragm type vacuum lamination, air-pressure lamination, and so on. Among others, it is preferred to use vacuum lamination and air-pressure in combination.

Here, description will be given as to an example of using the vacuum lamination apparatus manufactured by Nichigo-Morton Co., Ltd. to encapsulate a silicon wafer having a thickness of 250 μm and a diameter of 300 mm (12 inches) with an encapsulant having a supporting substrate having a thickness of 50 μm and a thermosetting resin layer comprising an uncured thermosetting silicone resin having a thickness of 50 μm on one side thereof.

In plates that have upper and lower built-in heaters and are set to 150° C., the upper plate has a diaphragm rubber appressed against the heater under reduced pressure. A silicon wafer of 300 mm (12 inches) is set on the lower plate, the encapsulant is set on one side of this silicon wafer so that the thermosetting resin layer surface can fit to a semiconductor forming surface of the silicon wafer. Thereafter, the lower plate is moved up, the upper and lower plates are closely attached to each other to form a vacuum chamber by an O-ring installed so as to surround the silicon wafer set on the lower plate, and a pressure in the vacuum chamber is reduced. When the pressure in the vacuum chamber is sufficiently reduced, a valve of a pipe communicating with a vacuum pump from a space between the diaphragm rubber of the upper plate and the heater is closed to send compressed air. According to this procedure, the upper diaphragm rubber inflates to sandwich the silicon wafer and the encapsulant between the upper diaphragm rubber and the lower plate, and vacuum lamination and curing of the thermosetting silicone resin simultaneously proceed, and encapsulating is completed. A curing time of approximately 3 to 20 minutes is enough. When the vacuum lamination is completed, the pressure in the vacuum chamber is restored to a normal pressure, the lower plate is moved down, and the encapsulated silicon wafer is taken out. According to the above-mentioned steps, encapsulating of the wafer without void or warp can be carried out. The taken-out silicon wafer is usually subjected to post cure at a temperature of 150 to 180° C. for 1 to 4 hours, thereby stabilizing electrical characteristics or mechanical characteristics.

The covering and encapsulating steps using the above-mentioned vacuum lamination apparatus are not restricted to the illustrated silicone resin, and they can be also used in the case of the epoxy resin or the mixed resin of epoxy and silicone.

According to such a method for manufacturing a semiconductor apparatus, by using the thermosetting resin layer which has a shape having a height difference to the thickness direction, at the covering step, the semiconductor devices mounting surface or the semiconductor devices forming surface can be covered by preventing from failure of the filling ability without adjusting a filling amount of the resin depending on a number of the faulty device(s) at the time of forming the encapsulating layer. Also, since the above-mentioned encapsulant is used, the supporting substrate can suppress shrinkage stress of the thermosetting resin layer at the time of curing, so that the semiconductor devices mounting surface or the semiconductor devices forming surface can be collectively encapsulated at the encapsulating step without generating voids. Thus, even when a thin and large diameter wafer or large sized substrate is encapsulated, the encapsulated substrate having semiconductor devices mounting thereon or the encapsulated wafer having semiconductor devices forming thereon in which warp of the substrate or the wafer or delamination of the semiconductor devices from the substrate could be suppressed can be obtained. Further, at the piece forming step, the semiconductor apparatus is diced into each piece from the encapsulated substrate having semiconductor devices mounting thereon or the encapsulated wafer having semiconductor devices forming thereon which has been encapsulated by the encapsulant excellent in encapsulating properties such as heat resistance and humidity resistance and warp can be suppressed, thereby providing the method for manufacturing a semiconductor apparatus that enables manufacturing a high quality semiconductor apparatus.

EXAMPLES

Hereinafter, the present invention is more specifically explained by referring to Examples and Comparative Examples of the present invention, but the present invention is not limited by these.

As a substrate having a semiconductor device mounting thereon (semiconductor devices mounting substrate), the following organic resin substrate having a semiconductor device mounting thereon was prepared.

Organic resin substrate having a semiconductor device mounting thereon: BT resin substrate (linear expansion coefficient: 15 ppm/° C.) having a thickness of 300 μm, a length of 220 mm and a width of 240 mm. Maximum 144 silicon chips having a thickness of 300 μm and 9 mm square can be mounted. Adhered by an epoxy die bonding material, and connected to the substrate with a gold wire.

As the supporting substrate, the following organic resin substrate having no semiconductor device mounting thereon was prepared.

Organic resin substrate having no semiconductor device mounting thereon: BT resin substrate (linear expansion coefficient: 15 ppm/° C.) having a thickness of 100 μm, a length of 214 mm and a width of 234 mm.

Example 1

Preparation of Composition for Forming the Thermosetting Resin Layer 60 parts by mass of a cresol novolac type epoxy resin (EOCN1020, available from Nippon Kayaku Co., Ltd.), 30 parts by mass of a phenol novolac resin (H-4, available from MEIWA PLASTIC INDUSTRIES, Ltd.), 400 parts by mass of spherical silica (available from TATSUMORI LTD., average particle size: 7 μm), 3 parts by mass of a hydrotalcite compound (available from KYOWAKASEI Co., Ltd. $Mg_{4.5}Al_2(OH)_{13} \cdot 3.5H_2O$, trade name: DHT-4A-2), 10 parts by mass of zinc molybdate (available from Japan Sherwin-Williams Company, trade name: 911B), 0.5 part by mass of lanthanum oxide (available from Shin-Etsu Chemical Co., Ltd.), 0.2 part by mass of a catalyst TPP (triphenylphosphine, available from HOKKO CHEMICAL INDUSTRY Co., Ltd.), 0.5 part by mass of a silane coupling agent (KBM403, available from Shin-Etsu Chemical Co., Ltd.) were sufficiently mixed by a high speed mixing apparatus, and then mixed and kneaded under heating by a continuously kneading apparatus to make a sheet, and the sheet was cooled. The sheet was pulverized to make granular powder to obtain a thermosetting epoxy resin composition (I-a).

[Preparation of Encapsulant]

A supporting substrate was set on the lower mold of a compression molding apparatus which can heat-compression under reduced pressure, and granular powder of the thermosetting epoxy resin composition (I-a) was uniformly dispersed thereon. The upper mold has a cavity, and the shape thereof is a length of 200 mm and a width of 220 mm at the entrance of the cavity, a length of 180 mm and a width of 200 mm at the deep part of the cavity, and a depth of the cavity of 550 μm.

Temperatures of the upper and the lower molds are set to 80° C., a fluorine resin coated PET film (delamination film) was set to the upper mold, and inside the mold was reduced to a vacuum level and compression molding was carried out for 3 minutes to prepare an encapsulant (I-b).

The thus obtained encapsulant (I-b) had a shape where the contact surface with the above-mentioned supporting substrate of the thermosetting resin layer has a length of 200 mm and a width of 220 mm, and the upper surface has a length of 180 mm, a width of 200 mm and a height of 545 μm.

[Covering and Encapsulating of Semiconductor Devices Mounting Substrate]

Figure 6:
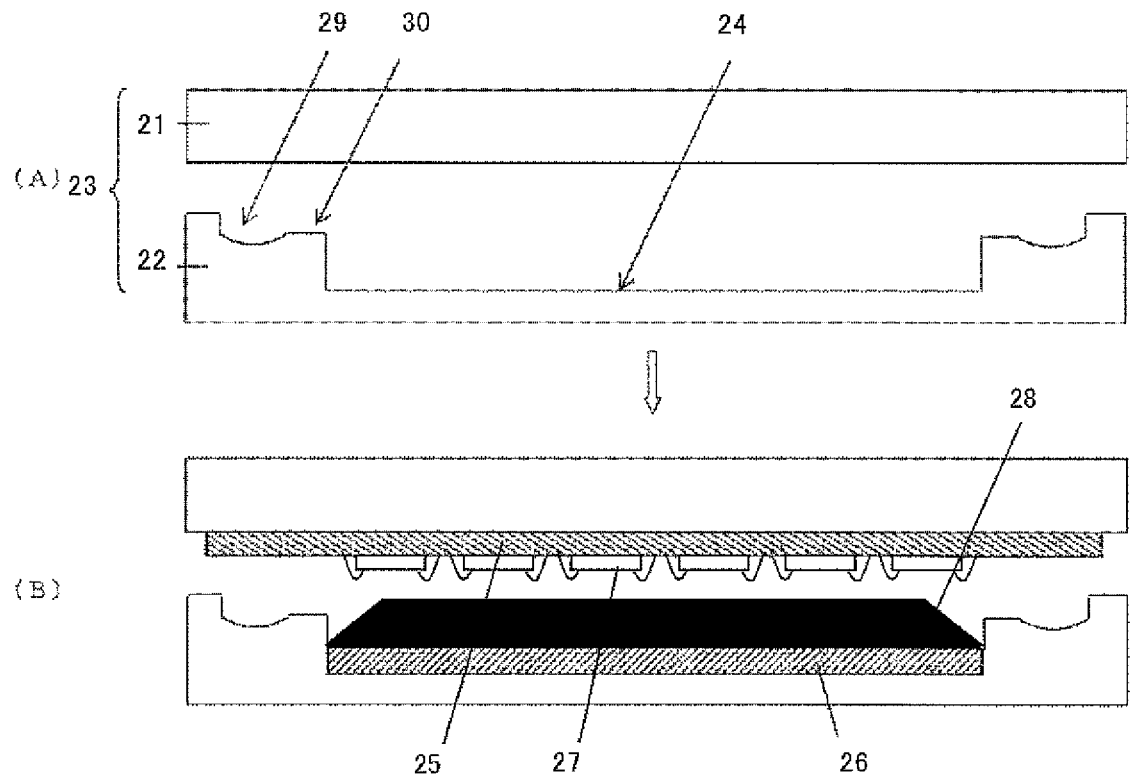
FIG. 6 is an example of a sectional drawing of a mold to be used for the coating step and the encapsulating step of the manufacturing a semiconductor apparatus of the present invention.

A metal mold 23 having a first cavity 24 and a second cavity 29 as shown in FIG. 6 was prepared. A mold temperature of the compression molding apparatus was set to 150° C., and the substrate 25 having semiconductor devices mounting thereon was adsorbed to the upper mold 21 by suction. On the other hand, the supporting substrate 26 of the encapsulant (I-b) was similarly adsorbed to the lower mold 22 by suction. Thereafter, the periphery of the mold was encapsulated, and after the inside thereof was made a vacuum degree of 5 kPa by degassing, the upper and the lower molds were closed. A distance between the substrates was made 400 μm. Subsequently, a pressure of 20 Kg/cm$^2$ was applied thereto to fill the resin inside the first cavity 24 and the excess resin and voids were discharged to the second cavity 29 through a runner 30. At this time, an air was introduced into the second cavity 29 so as not to lower to the thermosetting resin layer 28. The molding time was 3 minutes.

After molding, the integrated substrate was taken out of the mold, and cooled to room temperature. Thereafter, when the encapsulating layer was examined, no defect such as lack of the resin and formation of voids was generated. Also, when warp of the substrate was measured, then the amount of warp was 0.1 mm in the longitudinal direction and 0.1 mm in the short direction. Further, it was post cured at 180° C. for 4 hours, and warp was similarly measured. As a result, it was 0.1 mm in the longitudinal direction and 0.1 mm in the short direction thereby it was substantially no warp.

This substrate was adhered to a dicing tape, and diced into 144 pieces. A solder ball was attached to the back surface of each semiconductor apparatus to manufacture semiconductor apparatuses, and the following heat resistance test and humidity resistance test were carried out. In the heat resistance test, a heat cycle test (retained at −25° C. for 10 minutes, and retained at 125° C. for 10 minutes which procedure was repeated 1000 cycles) was carried out to the test piece, and whether the conduction was possible or not after the test was evaluated. Also, in the humidity resistance test, the direct voltage of 10V was applied to the both poles of the circuit of the test piece under the conditions of a temperature of 85° C. under a relative humidity of 85%, and whether the short-circuit was caused or not was evaluated by using a migration tester (manufactured by IMV Co., MIG-86). As a result, they were all acted without problem. According to this, it could be clarified that they had excellent heat resistance and humidity resistance.

Also, by using the substrate having semiconductors mounted thereon in which the silicon chips were not mounted with 144 chips (1 to 20 were lacked), collective encapsulating was carried out repeatedly under the same conditions as mentioned above. When examination of the encapsulating layer was carried out, no defect such as lack of the resin and formation of voids was generated. Also, when warp of the substrate was measured, then the amount of warp was 0.1 mm in the longitudinal direction and 0.1 mm in the short direction, and it was the same value after post curing thereby it was substantially no warp. Further, the substrate was diced and when the heat resistance test and humidity resistance test of the semiconductor apparatus having a silicon chip mounted thereon were carried out under the same conditions, they were all acted without problem.

Example 2

Synthetic Example 1

Organic Silicon Compound Having a Non-Conjugated Double Bond (A1)

In a toluene solvent were dissolved 27 mol of an organosilane represented by $PhSiCl_3$, 1 mol of $ClMe_2SiO(Me_2SiO)_{33}SiMe_2Cl$ and 3 mol of $MeViSiCl_2$, and the solution was dropped into water, co-hydrolyzed, rinsed, neutralized by alkali cleaning, and dehydrated, and then the solvent was stripped to synthesize an organic silicon compound having a non-conjugated double bond (A1). A composition ratio of a constituent unit of this resin is represented by the formula: $[PhSiO_{3/2}]_{0.27}[—SiMe_2O—(Me_2SiO)_{33}—SiMe_2O—]_{0.01}[MeViSiO_{2/2}]_{0.03}$. A weight average molecular weight of the compound was 62,000, and a melting point of the same was 60° C. Incidentally, Me and Ph in the compositional formula herein represent a methyl group and a phenyl group, respectively, and Vi represents a vinyl group represented by —CH=CH$_2$ (hereinafter the same.).

Synthetic Example 2

Organohydrogen Polysiloxane (B1)

In a toluene solvent were dissolved 27 mol of organosilane represented by $PhSiCl_3$, 1 mol of $ClMe_2SiO(Me_2SiO)_{33}SiMe_2Cl$ and 3 mol of $MeHSiCl_2$, and the solution was dropped into water, co-hydrolyzed, rinsed, neutralized by alkali cleaning, and dehydrated, and then the solvent was stripped to synthesize an organohydrogen polysiloxane (B1). A composition ratio of a constituent unit of this resin is represented by the formula: $[PhSiO_{3/2}]_{0.27}[—SiMe_2O—(Me_2SiO)_{33}—SiMe_2O—]_{0.01}[MeHSiO_{2/2}]_{0.03}$. A weight average molecular weight of the resin was 58,000, and a melting point of the same was 58° C.

[Preparation of Composition for Forming Thermosetting Resin Layer]

To a composition containing 50 parts by mass of the above-mentioned organic silicon compound having a non-conjugated double bond (A1), 50 parts by mass of the organohydrogen polysiloxane (B1), 0.2 part by mass of an acetylene alcohol series ethynylcyclohexanol as a reaction inhibitor, and 0.1 part by mass of an octyl alcohol modified solution of chloroplatinic acid was further added 350 parts by mass of spherical silica having an average particle size of 5 µm, and the mixture was stirred well by a planetary mixer heated to 60° C. to prepare a thermosetting silicone resin composition (II-a). This composition was a solid at room temperature (25° C.)

[Preparation of Encapsulant]

A plate temperature was set to 80° C. by using a vacuum lamination apparatus manufactured by Nichigo-Morton Co., Ltd. The above-mentioned supporting substrate was set to the lower side plate, and the thermosetting silicone resin composition (II-a) was covered from above while setting the above-mentioned supporting substrate. The surface of the above was further covered by a fluorine resin coated PET film (delamination film), then the plates were closed and subjected to vacuum compression molding for 2 minutes to prepare an encapsulant (II-b) in which the supporting substrate and the thermosetting resin layer comprising the thermosetting silicone resin composition (II-a) had been laminated.

In the thus obtained encapsulant (II-b), the thermosetting resin layer which is an encapsulant was not a rectangular parallelepiped shape, but a shape wherein the thickness at the center portion was 450 µm, the thickness was decreased toward the peripheral portion and the thickness at the peripheral portion was 400 µm.

[Covering and Encapsulating of Semiconductor Devices Mounting Substrate]

The similar mold as used in Example 1 was prepared. A mold temperature of the compression molding apparatus was set to 120° C., and the substrate having semiconductor devices mounting thereon was adsorbed to the upper mold by suction. On the other hand, the encapsulant (II-b) was similarly adsorbed to the lower mold by suction. Thereafter, the periphery of the mold was encapsulated, and after the inside thereof was made a vacuum degree of 5 kPa by degassing, the upper and the lower molds were closed. A distance between the substrates was made 400 µm. Subsequently, a pressure of 20 Kg/cm$^2$ was applied thereto to fill the resin inside the first cavity and the excess resin and voids were discharged to the second cavity through a runner. At this time, an air was introduced into the second cavity so as not to lower to the thermosetting resin layer. The molding time was 2 minutes.

After molding, the integrated substrate was taken out of the mold, and cooled to room temperature. Thereafter, when the encapsulating layer was examined, no defect such as lack of the resin and formation of voids was generated. Also, when warp of the substrate was measured, then the amount of warp was 0.1 mm in the longitudinal direction and 0.1 mm in the short direction. Further, it was post cured at 150° C. for 4 hours, and warp was similarly measured. As a result, it was 0.1 mm in the longitudinal direction and 0.1 mm in the short direction thereby it was substantially no warp.

This substrate was adhered to a dicing tape, and diced into 144 pieces. A solder ball was attached to the back surface of each semiconductor apparatus to manufacture semiconductor apparatuses, and the following heat resistance test and humidity resistance test were carried out. In the heat resistance test, a heat cycle test (retained at −25° C. for 10 minutes, and retained at 125° C. for 10 minutes which procedure was repeated 1000 cycles) was carried out to the test piece, and whether the conduction was possible or not after the test was evaluated. Also, in the humidity resistance test, the direct voltage of 10V was applied to the both poles of the circuit of the test piece under the conditions of a temperature of 85° C. under a relative humidity of 85%, and whether the short-circuit was caused or not was evaluated by using a migration tester (manufactured by IMV Co., MIG-86). As a result, they were all acted without problem. According to this, it could be clarified that they had excellent heat resistance and humidity resistance.

Comparative Example 1

Manufacture of Encapsulant

In the same manner as in Example 1, a supporting substrate was set on the lower mold of a compression molding apparatus which can heat-compression under reduced pressure, and granular powder of the thermosetting epoxy resin composition (I-a) was uniformly dispersed thereon. The upper mold has a cavity, and the shape thereof is a length of 90 mm and a width of 100 mm at the entrance of the cavity, a length of 90 mm and a width of 100 mm at the deep part of the cavity, and a depth of the cavity of 2.5 mm.

Temperatures of the upper and the lower molds are set to 80° C., a fluorine resin coated PET film (delamination film) was set to the upper mold, and inside the mold was reduced to a vacuum level and compression molding was carried out for 3 minutes to prepare an encapsulant (II-c).

The thus obtained encapsulant (II-c) had a shape where the contact surface with the above-mentioned supporting substrate of the thermosetting resin layer has a length of 90 mm and a width of 100 mm, and the upper surface has a length of 90 mm, a width of 100 mm and a height of 2.49 mm.

[Covering and Encapsulating of Semiconductor Devices Mounting Substrate]

The similar mold as used in Example 1 was prepared. A mold temperature of the compression molding apparatus was set to 120° C., and the substrate having semiconductor devices mounting thereon was adsorbed to the upper mold by suction. On the other hand, the encapsulant (II-c) was similarly adsorbed to the lower mold by suction. Thereafter, the periphery of the mold was encapsulated, and after the inside thereof was made a vacuum degree of 5 kPa by degassing, the upper and the lower molds were closed. A distance between the substrates was made 400 μm. Subsequently, a pressure of 20 Kg/cm² was applied thereto to fill the resin inside the first cavity and the excess resin and voids were discharged to the second cavity through a runner. At this time, an air was introduced into the second cavity so as not to lower to the thermosetting resin layer. The molding time was 2 minutes.

After molding, the integrated substrate was taken out of the mold, and cooled to room temperature. Thereafter, when the encapsulating layer was examined, it was found that voids were present at inside the encapsulating layer.

This substrate was adhered to a dicing tape, and diced into 144 pieces. A solder ball was attached to the back surface of each semiconductor apparatus to manufacture semiconductor apparatuses, and the following heat resistance test and humidity resistance test were carried out. In the heat resistance test, a heat cycle test (retained at −25° C. for 10 minutes, and retained at 125° C. for 10 minutes which procedure was repeated 1000 cycles) was carried out to the test piece, and whether the conduction was possible or not after the test was evaluated. Also, in the humidity resistance test, the direct voltage of 10V was applied to the both poles of the circuit of the test piece under the conditions of a temperature of 85° C. under a relative humidity of 85%, and whether the short-circuit was caused or not was evaluated by using a migration tester (manufactured by IMV Co., MIG-86). As a result, short-circuit was confirmed 3 pieces/144 pieces in the heat resistance test and 25 pieces/144 pieces in the humidity resistance test.

According to the above, it could be confirmed that the encapsulant of the present invention can suppress occurrence of warp of the substrate or the wafer, or delamination of the semiconductor devices from the substrate, can prevent from failure of the filling ability without adjustment of the filled amount of the resin, and can collectively encapsulate the semiconductor devices mounting surface of the substrate having the semiconductor devices mounting thereon or the semiconductor devices forming surface of the wafer having the semiconductor devices forming thereon, and after encapsulating, it becomes an encapsulant having excellent encapsulating properties such as heat resistance and humidity resistance and has very high general versatility.

It must be stated here that the present invention is not restricted to the embodiments shown by the above-mentioned embodiments. The above-mentioned embodiments are merely examples so that any embodiments composed of substantially the same technical concept as disclosed in the claims of the present invention and expressing a similar effect are included in the technical scope of the present invention.

What is claimed is:

1. An encapsulant for collectively encapsulating a semiconductor devices mounting surface of a substrate having semiconductor devices mounting thereon or a semiconductor devices forming surface of a wafer having semiconductor devices forming thereon, comprising
a supporting substrate and
a thermosetting resin layer, being laminated to the supporting substrate, and having a thickness varying from a central portion to a peripheral portion thereof,
wherein the supporting substrate and the substrate having semiconductor devices mounting thereon or the wafer having semiconductor devices forming thereon have a difference in linear expansion coefficients of 5 ppm or less.

2. The encapsulant according to claim 1, wherein the thermosetting resin layer comprises an uncured or semi-cured thermosetting resin.

3. The encapsulant according to claim 2, wherein a thickness of the thermosetting resin layer is 20 μm or more and 2,000 μm or less.

4. The encapsulant according to claim 2, wherein a ratio of a contact area of the thermosetting resin layer and the supporting substrate to a surface area of the supporting substrate is 20 to 100%.

5. The encapsulant according to claim 3, wherein a ratio of a contact area of the thermosetting resin layer and the supporting substrate to a surface area of the supporting substrate is 20 to 100%.

6. The encapsulant according to claim 1, wherein the thermosetting resin layer contains either of an epoxy resin, a silicone resin and an epoxy-silicone mixed resin each of which solidifies at lower than 50° C., and melts at 50° C. or higher and 150° C. or lower.

7. The encapsulant according to claim 6, wherein a thickness of the thermosetting resin layer is 20 μm or more and 2,000 μm or less.

8. The encapsulant according to claim 6, wherein a ratio of a contact area of the thermosetting resin layer and the supporting substrate to a surface area of the supporting substrate is 20 to 100%.

9. The encapsulant according to claim 7, wherein a ratio of a contact area of the thermosetting resin layer and the supporting substrate to a surface area of the supporting substrate is 20 to 100%.

10. The encapsulant according to claim 2, wherein the thermosetting resin layer contains either of an epoxy resin, a silicone resin and an epoxy-silicone mixed resin each of which solidifies at lower than 50° C., and melts at 50° C. or higher and 150° C. or lower.

11. The encapsulant according to claim 10, wherein a thickness of the thermosetting resin layer is 20 μm or more and 2,000 μm or less.

12. The encapsulant according to claim 10, wherein a ratio of a contact area of the thermosetting resin layer and the supporting substrate to a surface area of the supporting substrate is 20 to 100%.

13. The encapsulant according to claim 11, wherein a ratio of a contact area of the thermosetting resin layer and the supporting substrate to a surface area of the supporting substrate is 20 to 100%.

14. The encapsulant according to claim 1, wherein a thickness of the thermosetting resin layer is 20 μm or more and 2,000 μm or less.

15. The encapsulant according to claim 14, wherein a ratio of a contact area of the thermosetting resin layer and the supporting substrate to a surface area of the supporting substrate is 20 to 100%.

16. The encapsulant according to claim 1, wherein a ratio of a contact area of the thermosetting resin layer and the supporting substrate to a surface area of the supporting substrate is 20 to 100%.

17. An encapsulated substrate having semiconductor devices mounting thereon, wherein the substrate having the semiconductor devices mounting thereon is collectively encapsulated with the encapsulant according to claim 1 by covering a semiconductor devices mounting surface of the substrate having the semiconductor devices mounting thereon with the thermosetting resin layer of the encapsulant and heating and curing the thermosetting resin layer.

18. A semiconductor apparatus which comprises dicing the encapsulated substrate having semiconductor devices mounting thereon according to claim 17 into each piece.

19. An encapsulated wafer having semiconductor devices forming thereon, wherein the wafer having the semiconductor devices forming thereon is collectively encapsulated with the encapsulant according to claim 1 by covering a semiconductor devices forming surface of the wafer having the semiconductor devices forming thereon with the thermosetting resin layer of the encapsulate and heating and curing the thermosetting resin layer.

20. A semiconductor apparatus which comprises dicing the encapsulated wafer having semiconductor devices forming thereon according to claim 19 into each piece.

21. A method for manufacturing a semiconductor apparatus which comprises the steps of
a covering step of covering the semiconductor devices mounting surface of the substrate having semiconductor devices mounting thereon or the semiconductor devices forming surface of the wafer having semiconductor devices forming thereon by the thermosetting resin layer possessed by the encapsulant according to claim 1,
an encapsulating step of collectively encapsulating the semiconductor devices mounting surface of the substrate having the semiconductor devices mounting thereon or the semiconductor devices forming surface of the wafer having semiconductor devices forming thereon by heating and curing the thermosetting resin layer to provide an encapsulated substrate having semiconductor devices mounting thereon or an encapsulated wafer having semiconductor devices forming thereon, and
a piece forming step of dicing the encapsulated substrate having semiconductor devices mounting thereon or the encapsulated wafer having semiconductor devices forming thereon into each piece to manufacture the semiconductor apparatus.

22. The method for manufacturing a semiconductor apparatus according to claim 21, wherein the covering step is carried out by compression molding or vacuum lamination.

23. The method for manufacturing a semiconductor apparatus according to claim 22, wherein the covering step has a resin filling step of filling inside of the cavity for forming the encapsulating layer by using an encapsulant on which a thermosetting resin layer with an amount larger than the amount necessary for forming the encapsulating layer has been laminated, and discharging the excessive thermosetting resin outside the cavity.

24. The method for manufacturing a semiconductor apparatus according to claim 23, wherein the thermosetting resin is molded by reducing the pressure of an atmosphere inside the cavity in the covering step.

25. The method for manufacturing a semiconductor apparatus according to claim 21, wherein the covering step has a resin filling step of filling inside of the cavity for forming the encapsulating layer by using an encapsulant on which a thermosetting resin layer with an amount larger than the amount necessary for forming the encapsulating layer has been laminated, and discharging the excessive thermosetting resin outside the cavity.

26. The method for manufacturing a semiconductor apparatus according to claim 25, wherein the thermosetting resin is molded by reducing the pressure of an atmosphere inside the cavity in the covering step.

* * * * *